United States Patent
Nakayama

(10) Patent No.: US 12,117,502 B2
(45) Date of Patent: Oct. 15, 2024

(54) EARTH LEAKAGE DETECTION DEVICE AND VEHICLE POWER SUPPLY SYSTEM

(71) Applicant: SANYO Electric Co., Ltd., Osaka (JP)

(72) Inventor: Masato Nakayama, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 221 days.

(21) Appl. No.: 17/756,053

(22) PCT Filed: Aug. 18, 2020

(86) PCT No.: PCT/JP2020/031045
§ 371 (c)(1),
(2) Date: May 16, 2022

(87) PCT Pub. No.: WO2021/106284
PCT Pub. Date: Jun. 3, 2021

(65) Prior Publication Data
US 2022/0404432 A1    Dec. 22, 2022

(30) Foreign Application Priority Data
Nov. 26, 2019    (JP) ................ 2019-213255

(51) Int. Cl.
*G01R 31/52*    (2020.01)
*B60L 3/00*    (2019.01)
(Continued)

(52) U.S. Cl.
CPC ......... *G01R 31/52* (2020.01); *B60L 3/0023* (2013.01); *G01R 19/16576* (2013.01); *G01R 31/006* (2013.01)

(58) Field of Classification Search
USPC .................................... 324/503, 509
See application file for complete search history.

(56) References Cited

U.S. PATENT DOCUMENTS

| | | | |
|---|---|---|---|
| 2005/0073320 A1 | 4/2005 | Yamamoto et al. | |
| 2007/0132459 A1 | 6/2007 | Yamamoto et al. | |
| (Continued) | | | |

FOREIGN PATENT DOCUMENTS

| | | |
|---|---|---|
| JP | 2004-053367 | 2/2004 |
| JP | 2009-053133 A | 3/2009 |
| JP | 2014-098681 A | 5/2014 |

OTHER PUBLICATIONS

International Search Report of PCT application No. PCT/JP2020/031045 dated Nov. 10, 2020.
(Continued)

*Primary Examiner* — Vincent Q Nguyen
(74) *Attorney, Agent, or Firm* — WHDA, LLP

(57) ABSTRACT

An earth leakage detection device includes the following items. Voltage output unit generates a periodically changing periodic voltage and applies the periodic voltage to the other end of coupling capacitor via first resistor. Second resistor and third resistor are connected in series between a connection point between coupling capacitor and first resistor, and a predetermined fixed potential. Voltage measurement unit measures a voltage at a voltage dividing point between second resistor and third resistor. Diagnosis unit determines whether or not coupling capacitor is normal based on a voltage measured when switch is turned on in a state where voltage output unit outputs a fixed voltage.

7 Claims, 4 Drawing Sheets

(51) Int. Cl.
    *G01R 19/165*     (2006.01)
    *G01R 31/00*     (2006.01)

(56) References Cited

U.S. PATENT DOCUMENTS

| | | | |
|---|---|---|---|
| 2009/0108850 A1* | 4/2009 | Yamagami | G01R 31/1272 324/551 |
| 2012/0025844 A1 | 2/2012 | Morita | |
| 2013/0245869 A1* | 9/2013 | Nishida | B60L 3/12 701/22 |

OTHER PUBLICATIONS

Extended (Supplementary) European Search Report dated Dec. 21, 2022, issued in counterpart EP application No. 20894330.8. (11 pages).
Extended (Supplementary) European Search Report dated Dec. 21, 2022, issued in counterpart EP application No. 16887848. (11 pages).

* cited by examiner

Power supply system 5

EARTH LEAKAGE DETECTION DEVICE AND VEHICLE POWER SUPPLY SYSTEM

CROSS-REFERENCE TO RELATED APPLICATIONS

This application is a U.S. national stage application of the PCT International Application No. PCT/JP2020/031045 filed on Aug. 18, 2020, which claims the benefit of foreign priority of Japanese patent application No. 2019-213255 filed on Nov. 26, 2019, the contents all of which are incorporated herein by reference.

TECHNICAL FIELD

The present invention relates to an earth leakage detection device that detects an earth leakage from a load insulated from a ground, and a vehicle power supply system.

BACKGROUND ART

In recent years, hybrid vehicles (HV), plug-in hybrid vehicles (PHV), and electric vehicles (EV) have become widespread. In these electric vehicles, a high-voltage driving battery (traction battery) is mounted separately from an auxiliary battery (generally, a lead battery having an output of 12 V). In order to prevent an electric shock, a high-voltage circuit including a high-voltage driving battery, an inverter, and a drive motor are insulated from a body (chassis ground) of a vehicle.

Y capacitors are inserted between a positive wiring of the high-voltage circuit on a vehicle side and the chassis ground and between a negative wiring of the high-voltage circuit on the vehicle side and the chassis ground, respectively, so that a power source supplied from the high-voltage driving battery to the load on the vehicle side is stabilized. An earth leakage detection device that monitors an insulation resistance between the high-voltage circuit and the chassis ground, and detects an earth leakage is mounted.

In an AC type earth leakage detection device, a pulse voltage is applied to a positive-electrode terminal or a negative-electrode terminal of a driving battery via a resistor and a coupling capacitor, a voltage at a node between the resistor and the coupling capacitor is measured, and presence or absence of an earth leakage is detected.

In the AC type earth leakage detection device, as a method of diagnosing a failure of the coupling capacitor, there is a method of diagnosing based on a fluctuation in crest value when a relay (contactor) between a battery and a vehicle is opened and closed. When the fluctuation in crest value is less than or equal to a specified value, it is determined that an abnormality has occurred in the coupling capacitor (see, for example, PTL 1).

CITATION LIST

Patent Literature

PTL 1: Unexamined Japanese Patent Publication No. 2004-53367

SUMMARY OF THE INVENTION

In the above-described coupling capacitor failure diagnosis method, it is necessary to measure the fluctuation of the crest value, and thus it is necessary to specify a voltage of a lower peak value as an upper peak value of the crest value. If the measurement timing of the upper peak value or the lower peak value deviates, an accurate crest value cannot be measured. In addition, since the crest value is not determined unless both the upper peak value and the lower peak value are measured, there is a time restriction on a measurement cycle of the crest value. It takes time to make a plurality of determinations. The same applies to a case of diagnosing the failure of the coupling capacitor based on the fluctuation of the upper peak value of the crest value or the fluctuation of the lower peak value of the crest value.

The present disclosure has been made in view of such a situation, and an object of the present disclosure is to provide a technique for quickly and accurately performing failure diagnosis of a coupling capacitor of an earth leakage detection device.

In order to solve the above problem, an earth leakage detection device according to an aspect of the present disclosure is an earth leakage detection device mounted on a vehicle, including a power storage unit that is mounted in a state of being insulated from a chassis ground of the vehicle and supplies electric power to a load in the vehicle, and a switch inserted into a wiring connecting the power storage unit and the load, the earth leakage detection device including: a coupling capacitor including one end connected to a current path of the power storage unit connected to the load in a state of being insulated from a ground; a voltage output unit that generates a periodically changing periodic voltage and applies the periodic voltage to the other end of the coupling capacitor via a first resistor; a second resistor and a third resistor connected in series between a connection point between the coupling capacitor and the first resistor, and a predetermined fixed potential; a voltage measurement unit that measures a voltage at a voltage dividing point between the second resistor and the third resistor; an earth leakage determination unit that determines presence or absence of an earth leakage between the current path of the power storage unit and the ground based on a voltage measured by the voltage measurement unit in a state where the periodic voltage is output from the voltage output unit; and a diagnosis unit that determines whether or not the coupling capacitor is normal based on a voltage measured by the voltage measurement unit when the switch is turned on in a state where a fixed voltage is output from the voltage output unit.

According to the present disclosure, the failure diagnosis of the coupling capacitor of the earth leakage detection device can be performed quickly and with high accuracy.

DESCRIPTION OF EMBODIMENT

Comparative Example

Figure 1:
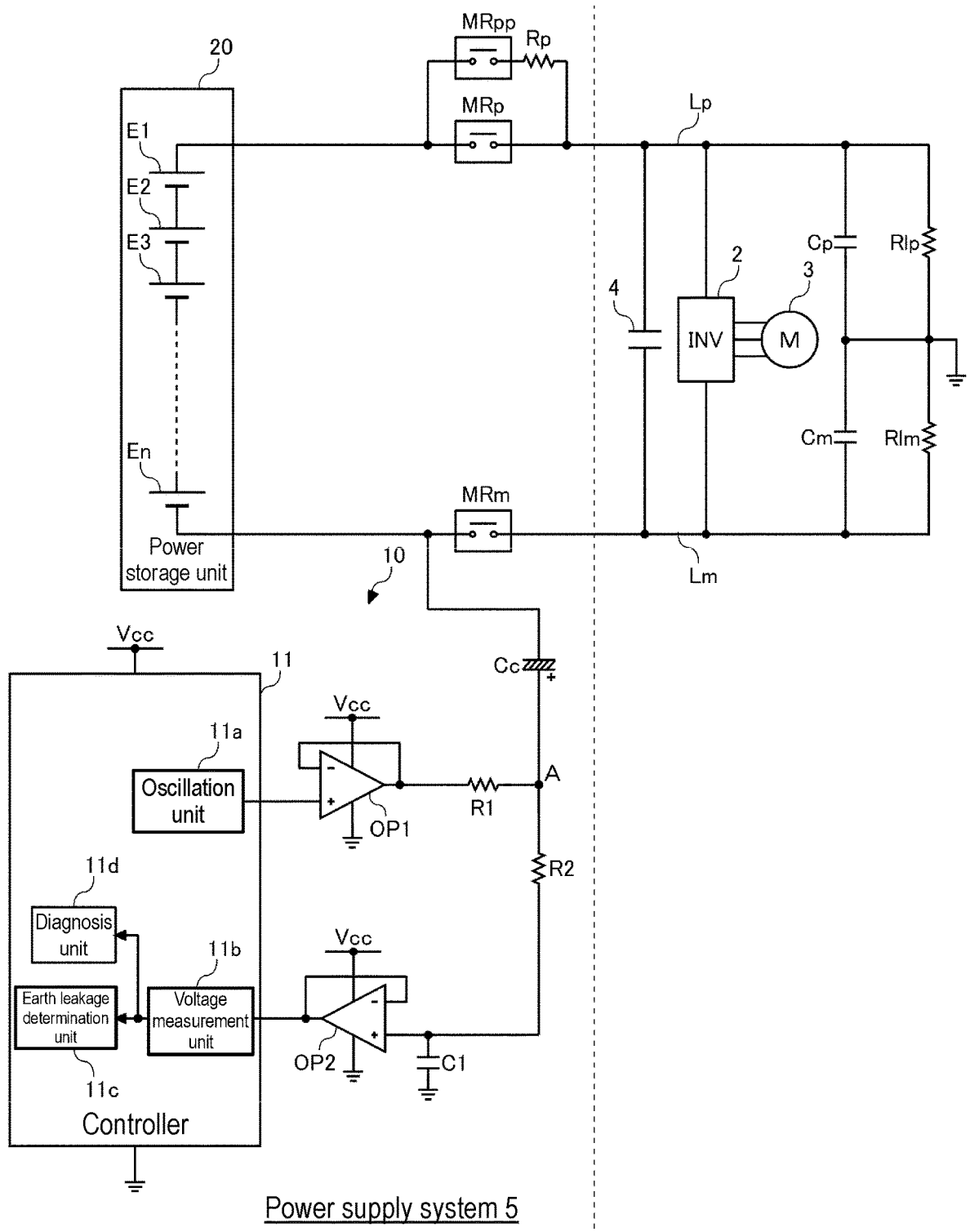
FIG. 1 is a diagram for explaining a configuration of a power supply system including an earth leakage detection device according to a comparative example.

FIG. 1 is a diagram for explaining a configuration of power supply system 5 including earth leakage detection device 10 according to a comparative example. Power supply system 5 is mounted on an electric vehicle. Power supply system 5 is provided separately from an auxiliary battery (typically, a lead battery with 12 V output is used) in the electric vehicle. Power supply system 5 includes high-voltage power storage unit 20 and earth leakage detection device 10. Power storage unit 20 includes a plurality of cells E1 to En connected in series. As the cells, a lithium ion battery cell, a nickel metal hydride battery cell, a lead battery cell, an electric double layer capacitor cell, a lithium ion capacitor cell, or the like can be used. Hereinafter, an example using a lithium ion battery cell (nominal voltage: 3.6 V to 3.7 V) is assumed in the present specification.

The electric vehicle includes inverter 2 and motor 3 as high-voltage loads. A positive electrode of power storage unit 20 and one end of inverter 2 are connected by positive wiring Lp, and a negative electrode of power storage unit 20 and the other end of inverter 2 are connected by negative wiring Lm. Large-capacity capacitor 4 is connected in parallel with inverter 2. Positive-side main relay MRp is inserted into positive wiring Lp, and negative-side main relay MRm is inserted into negative wiring Lm.

Precharge relay MRpp and precharge resistor Rp connected in series are connected in parallel with positive-side main relay MRp. Precharge relay MRpp is turned on (closed) before positive-side main relay MRp is turned on (closed), whereby capacitor 4 can be precharged with a limited current, and an inrush current can be suppressed. Note that the precharge relay and the precharge resistor connected in series may be connected in parallel to negative-side main relay MRm.

Positive-side main relay MRp, precharge relay MRpp, and negative-side main relay MRm function as contactors that control conduction and cutoff between power storage unit 20 and a high-voltage load in the electric vehicle. Note that, instead of the relay, a semiconductor switch having a high withstand voltage and a high insulation can be used.

Inverter 2 is a bidirectional inverter connected between power storage unit 20 and motor 3. At the time of power running, inverter 2 converts DC power supplied from power storage unit 20 into AC power, and supplies the AC power to motor 3. At the time of regeneration, the AC power supplied from motor 3 is converted into DC power, and the DC power is supplied to power storage unit 20. For example, a three-phase AC motor is used as motor 3. Motor 3 rotates in accordance with AC power supplied from inverter 2 at the time of power running. At the time of regeneration, a rotational energy due to deceleration is converted into AC power, and the AC power is supplied to inverter 2.

Power storage unit 20 is mounted on the electric vehicle in a state of being insulated from a chassis ground of the electric vehicle. The auxiliary battery is mounted on the electric vehicle in a state where a negative electrode is electrically connected to the chassis ground. Note that positive wiring Lp on a side of inverter 2 with respect to positive-side main relay MRp and the chassis ground are connected via positive-side Y capacitor Cp. In addition, negative wiring Lm on the side of inverter 2 with respect to negative-side main relay MRm and the chassis ground are connected via negative-side Y capacitor Cm. Positive-side Y capacitor Cp and negative-side Y capacitor Cm have a function of galvanically insulating positive wiring Lp and the chassis ground, and negative wiring Lm and the chassis ground, respectively, and stabilizing the voltages of positive wiring Lp and negative wiring Lm.

When power storage unit 20 is ideally insulated from the chassis ground, an intermediate potential of power storage unit 20 is maintained near the potential of the chassis ground. For example, when the voltage across power storage unit 20 is 250 V, a positive electrode potential of power storage unit 20 is maintained around +125 V, and a negative electrode potential is maintained around −125 V. In a state in which high-voltage power storage unit 20 and the chassis ground are electrically connected to each other, there is a risk of an electric shock when a human touches an exposed conducting part of the electric vehicle. Therefore, in the electric vehicle on which high-voltage power storage unit 20 is mounted, it is necessary to mount earth leakage detection device 10 and monitor an insulation state between the current path of power storage unit 20 connected to the high-voltage vehicle load, and the chassis ground. In FIG. 1, an insulation state between positive wiring Lp and the chassis ground is represented as positive-side earth leakage resistance Rlp, and an insulation state between negative wiring Lm and the chassis ground is represented as negative-side earth leakage resistance Rlm.

In the comparative example, earth leakage detection device 10 includes coupling capacitor Cc, first resistor R1, first operational amplifier OP1, second resistor R2, smoothing capacitor Cc, second operational amplifier OP2, and controller 11. Controller 11 includes oscillation unit 11a, voltage measurement unit 11b, earth leakage determination unit 11c, and diagnosis unit 11d. Controller 11 can include, for example, a microcomputer and a nonvolatile memory (for example, an electrically erasable programmable read-only memory (EEPROM) and a flash memory).

One end of coupling capacitor Cc is connected to a current path of power storage unit 20. In the example illustrated in FIG. 1, one end of coupling capacitor Cc is connected to the negative electrode of power storage unit 20. Note that one end of coupling capacitor Cc may be connected to the positive electrode of power storage unit 20, or may be connected to any node of the plurality of cells E1 to En in power storage unit 20. The other end of coupling capacitor Cc is connected to an output end of a voltage output unit via first resistor R1. A connection point between the other end of coupling capacitor Cc and first resistor R1 is measurement point A. Note that another impedance element may be used instead of first resistor R1.

In FIG. 1, an aluminum electrolytic capacitor capable of increasing the capacity at a relatively low cost is used as coupling capacitor Cc. The aluminum electrolytic capacitor has polarity, and in FIG. 1, the positive electrode of the aluminum electrolytic capacitor is connected to measurement point A, and the negative electrode of the aluminum electrolytic capacitor is connected to the negative electrode of power storage unit 20. Coupling capacitor Cc may be configured by connecting a plurality of aluminum electrolytic capacitors in series. In this case, even if a short-circuit failure occurs in one capacitor, galvanic insulation can be maintained by the remaining capacitors.

The voltage output unit described above generates a periodically changing periodic voltage, and applies the generated periodic voltage to the other end of coupling capacitor Cc via first resistor R1. Hereinafter, an example in which a rectangular wave voltage is used as the periodic voltage is assumed in the present specification.

The voltage output unit includes oscillation unit 11a and first operational amplifier OP1. Oscillation unit 11a includes a multivibrator and a local oscillator, and generates a rectangular wave having a preset frequency. The rectangular wave voltage generated by oscillation unit 11a is input to a non-inverting input terminal of first operational amplifier OP1. An output terminal of first operational amplifier OP1 is connected to first resistor R1. An inverting input terminal and the output terminal of first operational amplifier OP1 are connected. A positive power source terminal of first operational amplifier OP1 is connected to a first fixed potential (power source potential Vcc), and a negative power source terminal of first operational amplifier OP1 is connected to a second fixed potential (ground potential GND). Hereinafter, in the present specification, an example in which power source potential Vcc is 5 V and ground potential GND is 0 V is assumed.

First operational amplifier OP1 functions as a voltage follower that performs only impedance conversion with an amplification factor of one time. Note that, instead of first operational amplifier OP1, an AND gate having one input terminal connected to the first fixed potential or an OR gate having one input terminal connected to the second fixed potential may be used. First operational amplifier OP1 can be substituted as long as the element functions as a buffer that separates the impedance of controller 11 and the impedance of measurement point A.

Measurement point A is connected to a non-inverting input terminal of second operational amplifier OP2 via second resistor R2. An inverting input terminal and an output terminal of second operational amplifier OP2 are connected. Second operational amplifier OP2 also functions as a voltage follower that performs only impedance conversion with an amplification factor of one time. Smoothing capacitor C1 is connected between the non-inverting input terminal of second operational amplifier OP2 and the second fixed potential (ground potential GND). Smoothing capacitor C1 removes noise of the voltage input to the non-inverting input terminal of second operational amplifier OP2.

Second operational amplifier OP2 outputs a voltage at measurement point A to voltage measurement unit 11b. Voltage measurement unit 11b measures the voltage at measurement point A. Voltage measurement unit 11b includes an A/D converter, and the A/D converter samples an analog voltage at measurement point A at timing synchronized with the timing of a rising edge and a falling edge of the rectangular wave voltage generated by oscillation unit 11a, and converts the sampled analog voltage into a digital value. The voltage sampled at the timing of the rising edge of the rectangular wave voltage corresponds to a lower peak value of the measured voltage waveform, and the voltage sampled at the timing of the falling edge of the rectangular wave voltage corresponds to an upper peak value of the measured voltage waveform. Note that, in consideration of the blunting of the rectangular wave voltage, the timing at which the lower peak value should be sampled and the timing at which the upper peak value should be sampled may be adjusted. Voltage measurement unit 11b outputs the voltage at measurement point A to earth leakage determination unit 11c and diagnosis unit 11d.

Earth leakage determination unit 11c determines the presence or absence of an earth leakage between the current path of power storage unit 20 and the chassis ground based on the voltage at measurement point A measured by voltage measurement unit 11b. When a peak-to-peak value indicated by a difference between an upper peak value and a lower peak value is smaller than a set value, earth leakage determination unit 11c determines that an earth leakage occurs between the current path of power storage unit 20 and the chassis ground. The set value is determined on the basis of a peak-to-peak value of a measured voltage waveform at the time of occurrence of an earth leakage derived in advance by an experiment or simulation by a designer. When an earth leakage occurs between the current path of power storage unit 20 and the chassis ground, an AC current flows from first operational amplifier OP1 to coupling capacitor Cc via first resistor R1 acting as a detection resistor. When the current flows through first resistor R1, the voltage amplitude at measurement point A decreases due to a voltage drop.

Figure 2:
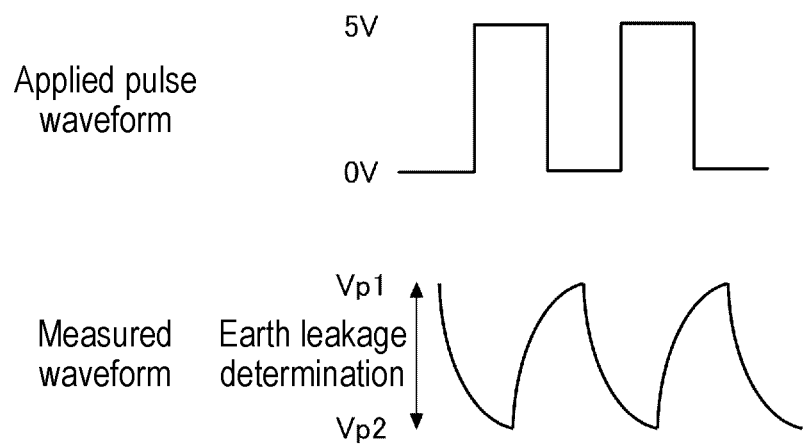
FIG. 2 is a diagram illustrating an example of an applied pulse waveform and a measured voltage waveform.

FIG. 2 is a diagram illustrating an example of an applied pulse waveform and a measured voltage waveform. In a pulse waveform applied from the voltage output unit to measurement point A, a high-side potential is set to 5 V, and a low-side potential is set to 0 V. Earth leakage determination unit 11c specifies an upper peak value Vp1 and a lower peak value Vp2 of the voltage waveform measured during a period in which the pulse voltage is applied to measurement point A, and determines the presence or absence of the earth leakage based on the peak-to-peak value defined by a difference between the upper peak value Vp1 and the lower peak value Vp2.

Returning to FIG. 1. Diagnosis unit 11d performs a failure diagnosis as to whether or not coupling capacitor Cc is normal based on the voltage at measurement point A measured by voltage measurement unit 11b. Specifically, in a state where a pulse voltage is applied from the voltage output unit to measurement point A, diagnosis unit 11d diagnoses coupling capacitor Cc on the basis of a change amount of a measured voltage before and after positive-side main relay MRp is turned on (closed), before and after positive-side main relay MRp is turned off (opened), before and after negative-side main relay MRm is turned on, or before and after negative-side main relay MRm is turned off.

Figure 3:
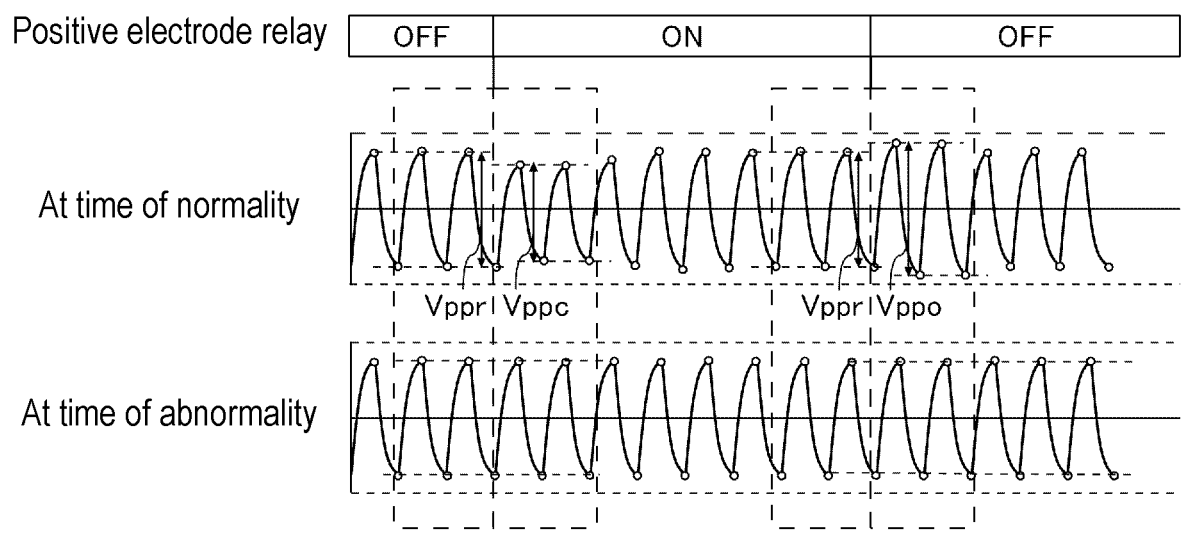
FIG. 3 is a diagram illustrating an example of a measured waveform at the time of failure diagnosis of coupling capacitor Cc according to the comparative example.

FIG. 3 is a diagram illustrating an example of a measured waveform at the time of failure diagnosis of coupling capacitor Cc according to the comparative example. FIG. 3 illustrates an example in which coupling capacitor Cc is diagnosed based on an amount of change in the measured voltage before and after positive-side main relay MRp is turned on and before and after positive-side main relay MRp is turned off.

Diagnosis unit 11d determines that coupling capacitor Cc is normal when a decrease amount of a peak-to-peak value Vppc of the measured voltage immediately after positive-side main relay MRp is turned on from a peak-to-peak value Vppr (specified value) of the measured voltage immediately before positive-side main relay MRp is less than or equal to a specified value, and determines that coupling capacitor Cc is abnormal when the decrease amount is not less than or equal to the specified value. When coupling capacitor Cc is normally connected to the vehicle, a change in an earth leakage state on the vehicle appears as a decrease in the measured waveform as positive-side main relay MRp is turned on. When coupling capacitor Cc is abnormal, this decrease in the measured waveform does not appear.

Further, diagnosis unit 11d may diagnose coupling capacitor Cc when positive-side main relay MRp is turned off. Diagnosis unit 11d determines that coupling capacitor Cc is normal when an increase amount of the peak-to-peak value Vppo of the measured voltage immediately after positive-side main relay MRp is turned off from the peak-to-peak value Vppr (reference value) of the measured voltage immediately before positive-side main relay MRp is turned off is greater than or equal to a specified value, and determines that coupling capacitor Cc is abnormal when the increase amount is not greater than or equal to the specified value. When coupling capacitor Cc is normally connected to the vehicle, a change in an earth leakage state on the vehicle appears as an increase in the measured waveform as positive-side main relay MRp is turned off. When coupling capacitor Cc is abnormal, this increase in the measured waveform does not appear.

Note that diagnosis unit 11d may determine that coupling capacitor Cc is normal when detecting fluctuations greater than or equal to respective specified values both when positive-side main relay MRp is turned on and off. In addition, in FIG. 3, coupling capacitor Cc is diagnosed based on the fluctuation in the measured voltage of the peak-to-peak value when positive-side main relay MRp is turned on or off, but coupling capacitor Cc may be diagnosed based on the fluctuation in the peak-to-peak value of the measured voltage when negative-side main relay MRm is turned on or off.

(Exemplary Embodiment)

Figure 4:
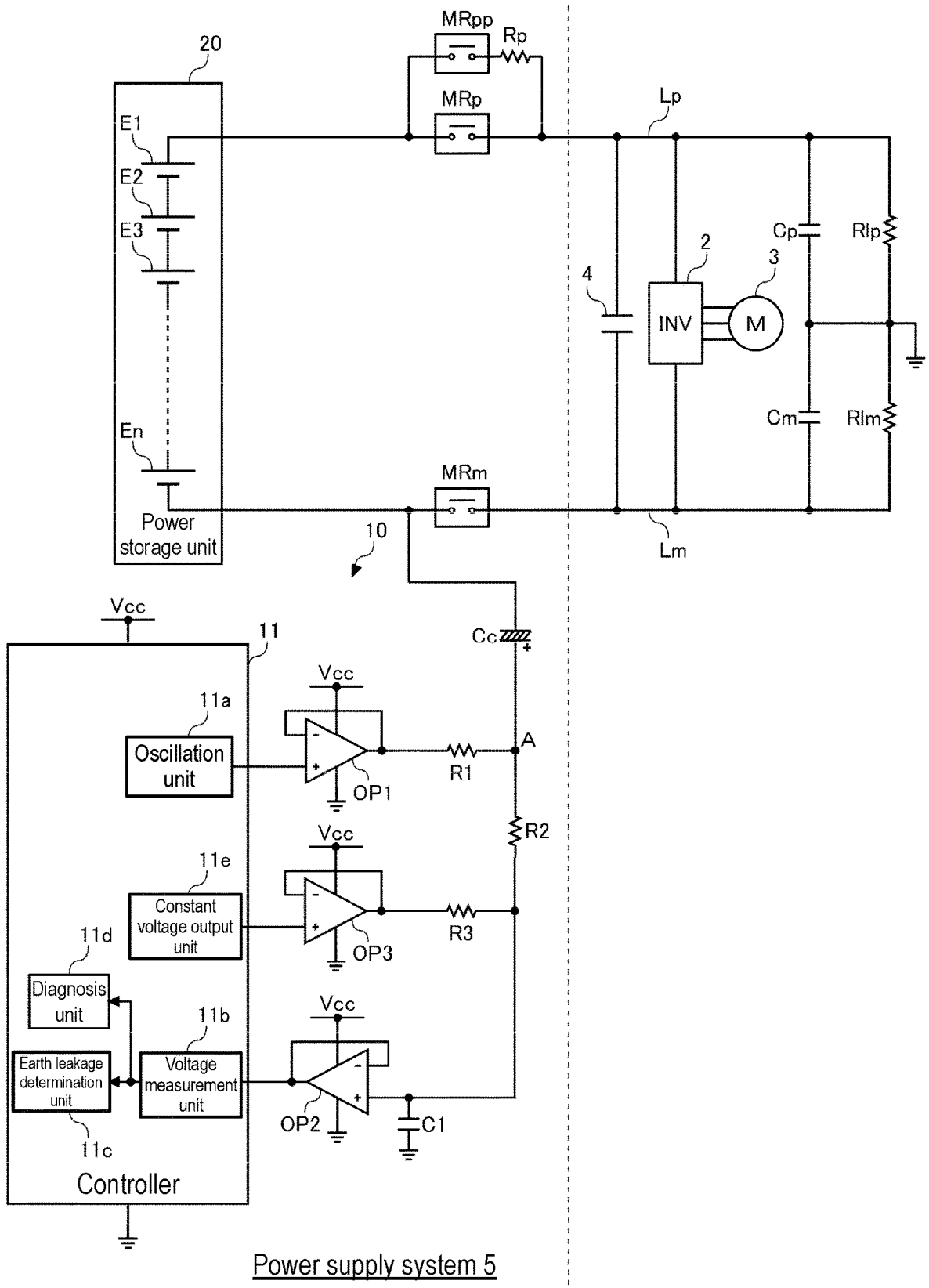
FIG. 4 is a diagram for explaining a configuration of a power supply system including an earth leakage detection device according to an exemplary embodiment.

FIG. 4 is a diagram for describing a configuration of power supply system 5 including earth leakage detection device 10 according to an exemplary embodiment. Hereinafter, differences from the configuration of power supply system 5 according to the comparative example illustrated in FIG. 1 will be described. In the exemplary embodiment, third resistor R3 and third operational amplifier OP3 are added. Controller 11 further includes constant voltage output unit 11e. Constant voltage output unit 11e can output a fixed voltage of at least one of a first reference voltage (5 V in the present exemplary embodiment) and a second reference voltage (0 V in the present exemplary embodiment).

In the present exemplary embodiment, oscillation unit 11a and first operational amplifier OP1 constitute a first voltage output unit, and constant voltage output unit 11e and third operational amplifier OP3 constitute a second voltage output unit. In the present exemplary embodiment, the first voltage output unit is also configured to be able to output a fixed voltage of at least one of the first reference voltage and the second reference voltage.

Second resistor R2 and third resistor R3 are connected in series between connection point A between coupling capacitor Cc and first resistor R1, and second voltage output unit. More specifically, a constant voltage output from constant voltage output unit 11e is input to a non-inverting input terminal of third operational amplifier OP3. An output terminal of third operational amplifier OP3 is connected to third resistor R3. An inverting input terminal and the output terminal of third operational amplifier OP3 are connected. Third operational amplifier OP3 also functions as a voltage follower that performs only impedance conversion with an amplification factor of one time.

In the present exemplary embodiment, a voltage at a voltage dividing point of second resistor R2 and third resistor R3 is input to the non-inverting input terminal of second operational amplifier OP2. That is, voltage measurement unit 11b measures a voltage at measurement point A with a compressed voltage by measuring the voltage at the voltage dividing point of second resistor R2 and third resistor R3. Earth leakage determination unit 11c calculates an earth leakage resistance value with reference to an earth leakage resistance conversion table based on an amplitude value of the voltage measured by voltage measurement unit 11b, and determines the presence or absence of an earth leakage between the current path of power storage unit 20 and the chassis ground. In the present exemplary embodiment, the voltage at measurement point A is divided and measured, so that a period during which the voltage at measurement point A deviates from a measurement range (0 V to 5 V in the present exemplary embodiment) can be reduced. That is, it is possible to reduce a period during which the earth leakage determination cannot be performed.

Diagnosis unit 11d diagnoses whether or not coupling capacitor Cc is normal based on the voltage measured by voltage measurement unit 11b during an on-sequence of positive-side main relay MRp, negative-side main relay MR, and precharge relay MRpp in a state where the fixed voltage is output from the first voltage output unit. Specifically, diagnosis unit 11d determines that coupling capacitor Cc is normal when a fluctuation range of a voltage measured during the on-sequence exceeds a specified value, and determines that coupling capacitor Cc is abnormal when the fluctuation range of the voltage measured during the on-sequence is less than or equal to the specified value.

The specified value is set based on data obtained by experiments or simulations by a designer.

Diagnosis unit 11d may diagnose coupling capacitor Cc when positive-side main relay MRp, negative-side main relay MR, and precharge relay MRpp are first turned on after the vehicle is started (key-on). In this case, the first voltage output unit outputs a fixed voltage from the first voltage output unit after the vehicle is started. An electronic control unit (ECU) (not illustrated) on the vehicle starts an on-sequence of positive-side main relay MRp, negative-side main relay MRm, and precharge relay MRpp after a predetermined time has elapsed from the start of the vehicle. Diagnosis unit 11d diagnoses coupling capacitor Cc during the on-sequence. After the end of the on-sequence, the first voltage output unit switches the output voltage from the fixed voltage to the pulse voltage, and earth leakage determination unit 11c starts monitoring an earth leakage.

Figure 5:
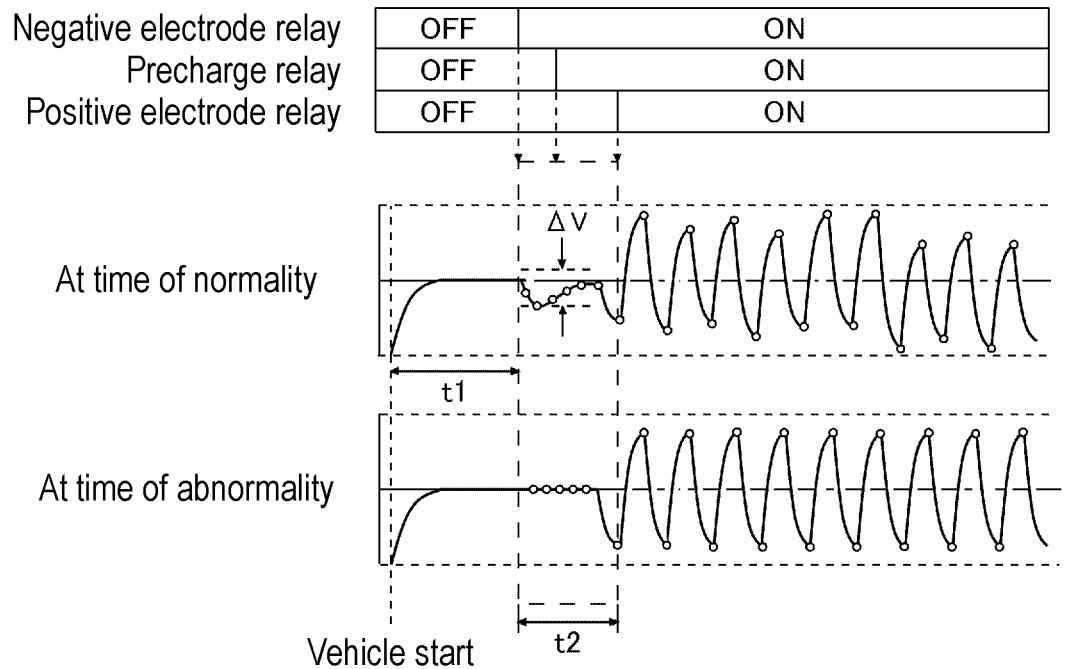
FIG. 5 is a diagram illustrating an example of a measured waveform at the time of failure diagnosis of coupling capacitor Cc according to the exemplary embodiment.

FIG. 5 is a diagram illustrating an example of a measured waveform at the time of failure diagnosis of coupling capacitor Cc according to the exemplary embodiment. The first voltage output unit outputs a fixed voltage after the vehicle is started. For example, when a resistance value of first resistor R1 is 200 kΩ, a resistance value of second resistor R2 is 1000 kΩ, and a resistance value of third resistor R3 is 1000 kΩ), and 5 V is output from the first voltage output unit and 0 V is output from the second voltage output unit, a fixed voltage measured by voltage measurement unit 11b is about 2.27 V as shown in the following (Formula 1). When 0 V is output from the first voltage output unit and 5 V is output from the second voltage output unit with similar circuit constants, the fixed voltage measured by voltage measurement unit 11b is about 2.73 V as shown in the following (Formula 2).

$$5\times(1000/(200+1000+1000))\approx 2.27 \quad \text{(Formula 1)}$$

$$5\times((200+1000)/(200+1000+1000))\approx 2.73 \quad \text{(Formula 2)}$$

In the example illustrated in FIG. 5, the ECU on the vehicle starts the on-sequence of positive-side main relay MRp, negative-side main relay MR, and precharge relay MRpp after several hundred ms have elapsed from the start of the vehicle. Elapsed time t1 is a time for eliminating the influence of blunting of the measured waveform by smoothing capacitor C1, and is a time until the measured waveform is stabilized.

In the example illustrated in FIG. 5, on-sequence period t2 is set to several hundred ms, and the ECU on the vehicle side turns on negative-side main relay MRm, precharge relay MRpp, and positive-side main relay MRp in this order during on-sequence period t2. Note that, when the precharge relay is connected to a side of the negative electrode, the ECU turns on positive-side main relay MRp, the precharge relay, and negative-side main relay MRm in this order.

Diagnosis unit 11d determines that coupling capacitor Cc is normal when fluctuation range ΔV of the measured voltage during on-sequence period t2 exceeds a specified value, and determines that coupling capacitor Cc is abnormal when fluctuation range ΔV of the measured voltage during on-sequence period t2 is less than or equal to the specified value. Fluctuation range ΔV is defined by a difference between a maximum value and a minimum value of the measured voltage during on-sequence period t2.

As described above, according to the present exemplary embodiment, the failure diagnosis of coupling capacitor Cc is performed based on fluctuation range ΔV of the measured voltage during on-sequence period t2 in a state where the fixed voltage is applied. As a result, the failure diagnosis of coupling capacitor Cc can be performed quickly and with high accuracy.

In the present exemplary embodiment, since the voltage at the voltage dividing point of second resistor R2 and third resistor R3 is measured, when a fixed voltage is applied, the fixed voltage can be measured in the vicinity of the middle of the measurement range. Therefore, even if the measured voltage increases or decreases, the fluctuation can be measured with high accuracy. On the other hand, in the circuit configuration according to the comparative example illustrated in FIG. 1, it is difficult to detect a decrease in the measured voltage when a fixed voltage of 0 V is applied, and it is difficult to detect an increase in the measured voltage when a fixed voltage of 5 V is applied.

Note that it is also conceivable to perform the failure diagnosis of coupling capacitor Cc based on the fluctuation of the upper peak value or the fluctuation of the lower peak value of the peak-to-peak value measured in a state where the pulse voltage is applied. However, since the peak-to-peak value usually varies in a cycle of several hundred ms or more, the upper peak value or the lower peak value can be detected only in a cycle of several hundred ms or more, and it takes time to sample the peak values at a plurality of points.

In this regard, with a fixed voltage, the value can be measured at a cycle of several tens of ms or less, and thus, it is possible to quickly determine the presence or absence of a voltage fluctuation exceeding a specified value. Even if initial stabilization time t1 is included, the diagnosis of coupling capacitor Cc can be completed within less than or equal to 1 s.

The present disclosure has been described above based on the exemplary embodiment. It is to be understood by the person of ordinary skill in the art that the exemplary embodiment is a merely example, that various modified examples can be made to combinations of the respective configuration elements and the respective processing processes, and that such modified examples are also within the scope of the present disclosure.

In the circuit configuration illustrated in FIG. 1, the voltage output unit may output a fixed voltage set to a value near a center of the measurement range of voltage measurement unit 11b, and diagnosis unit 11d may determine whether or not coupling capacitor Cc is normal based on a voltage measured during an on-sequence period of a contactor. The value near the center of the measurement range of voltage measurement unit 11b may be a value set within a range of ±1 V of the center voltage of the measurement range. For example, when the measurement range is 0 V to 5 V, the fixed voltage is set to a value within a range of 1.5 V to 3.5 V. Note that the value of the fixed voltage may be set outside a range of ±1 V of a center voltage of the measured range as long as the measured voltage is suppressed from sticking to an upper limit or a lower limit of the measurement range due to vertical fluctuation. Also in the above method, the same effects as those of the above exemplary embodiment can be obtained.

In the above exemplary embodiment, an example has been described in which the failure diagnosis of coupling capacitor Cc is performed at the time of starting the vehicle. In this regard, the failure diagnosis of coupling capacitor Cc may be performed after the vehicle is parked. In that case, since there is a margin in terms of time, on and off of the contactor may be repeated a plurality of times, and final diagnosis may be performed based on the determination results of the plurality of times.

In the above exemplary embodiment, precharge relay MRpp and precharge resistor Rp are connected in parallel with positive-side main relay MRp. However, in a case where the load is small, precharge relay MRpp and precharge resistor Rp may be omitted.

In the above exemplary embodiment, the example has been described in which the rectangular wave voltage is applied from the first voltage output unit to coupling capacitor Cc via first resistor R1. In this regard, a sinusoidal voltage may be applied to coupling capacitor Cc. Also in this case, earth leakage determination unit 11c can specify a peak-to-peak value from the voltage waveform at measurement point A, and determine the presence or absence of the earth leakage in the same manner as in the above exemplary embodiment.

In the above exemplary embodiment, an example in which earth leakage detection device 10 is mounted on an electric vehicle and used has been described. In this respect, earth leakage detection device 10 according to the above exemplary embodiment can also be applied to applications other than in-vehicle applications. The load may be any load as long as the load that receives power supply from power storage unit 20, and power storage unit 20 are insulated from the ground. For example, the load may be a load used in a railway vehicle.

Note that the exemplary embodiment may be specified by the following items.

[Item 1]

Earth leakage detection device (10) mounted on a vehicle, including power storage unit (20) that is mounted in a state of being insulated from a chassis ground of the vehicle and supplies electric power to load (2) in the vehicle, and switch (MRp, MRm, MRpp) inserted into a wiring connecting power storage unit (20) and load (2), the earth leakage detection device including:

coupling capacitor (Cc) including one end connected to a current path of power storage unit (20) connected to load (2) in a state of being insulated from a ground;

voltage output unit (11a, OP1) that generates a periodically changing periodic voltage and applies the periodic voltage to the other end of coupling capacitor (Cc) via first resistor (R1);

second resistor (R2) and third resistor (R3) connected in series between a connection point between coupling capacitor (Cc) and first resistor (R1), and a predetermined fixed potential;

voltage measurement unit (11b) that measures a voltage at a voltage dividing point between second resistor (R2) and third resistor (R3);

earth leakage determination unit (11c) that determines presence or absence of an earth leakage between the current path of power storage unit (20) and the ground based on a voltage measured by voltage measurement unit (11b) in a state where the periodic voltage is output from voltage output unit (11a, OP1); and diagnosis unit (11d) that determines whether or not coupling capacitor (Cc) is normal based on a voltage measured by voltage measurement unit (11b) when switch (MRp, MRm, MRpp) is turned on in a state where a fixed voltage is output from voltage output unit (11a, OP1).

Therefore, the failure diagnosis of coupling capacitor (Cc) can quickly be performed with high accuracy.

[Item 2] Earth leakage detection device (10) mounted on a vehicle, including power storage unit (20) that is mounted in a state of being insulated from a chassis ground of the vehicle and supplies electric power to load (2) in the vehicle, and switch (MRp, MRm, MRpp) inserted into a wiring connecting power storage unit (20) and load (2), the earth leakage detection device including:

voltage output unit (11a, OP1) that generates a periodically changing periodic voltage and applies the periodic voltage to the other end of coupling capacitor (Cc) via resistor (R1);

voltage measurement unit (11b) that measures a voltage at a connection point between coupling capacitor (Cc) and resistor (R1);

earth leakage determination unit (11c) that determines presence or absence of an earth leakage between a current path of power storage unit (20) and the ground based on a voltage measured by voltage measurement unit (11b) in a state where the periodic voltage is output from voltage output unit (11a, OP1); and diagnosis unit (11d) that determines whether or not coupling capacitor (Cc) is normal based on a voltage measured by voltage measurement unit (11b) when switch (MRp, MRm, MRpp) is turned on in a state where voltage output unit (11a, OP1) outputs a fixed voltage set to a value near a center of a measurement range of voltage measurement unit (11b).

Therefore, the failure diagnosis of coupling capacitor (Cc) can quickly be performed with high accuracy.

[Item 3]

Earth leakage detection device (10) according to Item 1 or 2, wherein when switch (MRp, MRm, MRpp) is turned on, diagnosis unit (11d) determines that coupling capacitor (Cc) is abnormal when a fluctuation range of a voltage measured by voltage measurement unit (11b) is less than or equal to a specified value.

Therefore, the failure diagnosis of coupling capacitor (Cc) can quickly be performed with high accuracy.

[Item 4]

Earth leakage detection device (10) according to Item 3, wherein switch (MRp, MRm, MRpp) includes:

positive electrode relay (MRp) inserted into a positive wiring, the positive wiring connecting a positive electrode of power storage unit (20) and one end of load (2);

negative electrode relay (MRm) inserted into a negative wiring, the negative wiring connecting a negative electrode of power storage unit (20) and the other end of load (2); and precharge relay (MRpp) connected in parallel to positive electrode relay (MRp) or negative electrode relay (MRm), and diagnosis unit (11d) determines that coupling capacitor (Cc) is abnormal when a fluctuation range of the measured voltage in a period from when one of three relays (MRp, MRm, MRpp) is turned on to when the three relays are turned on is less than or equal to the specified value.

According to this, in the configuration in which a contactor including the precharge relay is connected to load (2) on the vehicle side, the failure diagnosis of coupling capacitor (Cc) can be performed quickly and with high accuracy.

[Item 5]

Vehicle power supply system (5) including:

power storage unit (20) that is mounted in a state of being insulated from a chassis ground of the vehicle and supplies electric power to load (2) in the vehicle; and earth leakage detection device (10) according to any one of Items 1 to 4.

According to this, it is possible to achieve vehicle power supply system (5) including earth leakage detection device (10) capable of quickly and accurately performing the failure diagnosis of coupling capacitor (Cc).

[Item 6]

Vehicle power supply system (5) according to Item 5, wherein diagnosis unit (11d) determines whether or not coupling capacitor (Cc) is normal when switch (MRp, MRm, MRpp) is first turned on after the vehicle is started.

According to this, the failure diagnosis of coupling capacitor (Cc) can be performed without setting a special diagnosis period.

REFERENCE MARKS IN THE DRAWINGS

2: inverter
3: motor
4: capacitor
Lp: positive wiring
Lm: negative wiring
Cp: positive-side Y capacitor
Cm: negative-side Y capacitor
Rlp: positive-side earth leakage resistance
Rlm: negative-side earth leakage resistance
MRp: positive-side main relay
MRm: negative-side main relay
MRpp: precharge relay
Rp: precharge resistor
5: power supply system
20: power storage unit
E1 to En: cell
10: earth leakage detection device
11: controller
11a: oscillation unit
11b: voltage measurement unit
11c: earth leakage determination unit
11d: diagnosis unit
11e: constant voltage output unit
Cc: coupling capacitor
R1: first resistor
R2: second resistor
R3: third resistor
C1: smoothing capacitor
OP1: first operational amplifier
OP2: second operational amplifier
OP3: third operational amplifier

The invention claimed is:

1. An earth leakage detection device mounted on a vehicle, the earth leakage detection device including a power storage unit that is mounted in a state of being insulated from a chassis ground of the vehicle and supplies electric power to a load in the vehicle, and a switch inserted into a wiring connecting the power storage unit to the load, the earth leakage detection device comprising:

a coupling capacitor including one end connected to a current path of the power storage unit connected to the load in a state of being insulated from a ground;
a voltage output unit that generates a periodic voltage periodically changing and applies the periodic voltage to another end of the coupling capacitor via a first resistor;
a second resistor and a third resistor connected in series between a connection point between the coupling capacitor and the first resistor, and a predetermined fixed potential;
a voltage measurement unit that measures a voltage at a voltage dividing point between the second resistor and the third resistor;
an earth leakage determination unit that performs a first determination to determine whether or not an earth leakage occurs between the current path of the power storage unit and the ground based on a voltage measured by the voltage measurement unit in a state where the periodic voltage is output from the voltage output unit; and
a diagnosis unit that performs a second determination, different from the first determination, to determine whether or not the coupling capacitor is normal based on a voltage measured by the voltage measurement unit when the switch is turned on in a state where a fixed voltage is output from the voltage output unit.

2. The earth leakage detection device according to claim 1, wherein when the switch is turned on, the diagnosis unit determines that the coupling capacitor is abnormal when a fluctuation range of a voltage measured by the voltage measurement unit is less than or equal to a specified value.

3. The earth leakage detection device according to claim 2, wherein
the switch includes three relays that are:
a positive electrode relay inserted into a positive wiring, the positive wiring connecting a positive electrode of the power storage unit and one end of the load;
a negative electrode relay inserted into a negative wiring, the negative wiring connecting a negative electrode of the power storage unit and another end of the load; and
a precharge relay connected in parallel to the positive electrode relay or the negative electrode relay, and
the diagnosis unit determines that the coupling capacitor is abnormal when a fluctuation range of the measured voltage in a period from when one of the three relays is turned on to when the three relays are turned on is less than or equal to the specified value.

4. A vehicle power supply system comprising:
a power storage unit that is mounted in a state of being insulated from a chassis ground of the vehicle and supplies electric power to a load in the vehicle; and
the earth leakage detection device according to claim 1.

5. The vehicle power supply system according to claim 4, wherein the diagnosis unit determines whether or not the coupling capacitor is normal when the switch is first turned on after the vehicle is started.

6. An earth leakage detection device mounted on a vehicle, including a power storage unit that is mounted in a state of being insulated from a chassis ground of the vehicle and supplies electric power to a load in the vehicle, and a switch inserted into a wiring connecting the power storage unit and the load, the earth leakage detection device comprising:
a coupling capacitor including one end connected to a current path of the power storage unit connected to the load in a state of being insulated from a ground;
a voltage output unit that generates a periodically changing periodic voltage and applies the periodic voltage to another end of the coupling capacitor via a resistor;
a voltage measurement unit that measures a voltage at a connection point between the coupling capacitor and the resistor;
an earth leakage determination unit that performs a first determination to determine whether or not an earth leakage occurs between the current path of the power storage unit and the ground based on a voltage measured by the voltage measurement unit in a state where the periodic voltage is output from the voltage output unit; and
a diagnosis unit that performs a second determination, different from the first determination, to determine whether or not the coupling capacitor is normal based on a voltage measured by the voltage measurement unit when the switch is turned on in a state where the voltage output unit outputs a fixed voltage set to a value near a center of a measurement range of the voltage measurement unit.

7. An earth leakage detection device mounted on a vehicle, the earth leakage detection device including a power storage unit that is mounted in a state of being insulated from a chassis ground of the vehicle and supplies electric power to a load in the vehicle, and a switch inserted into a wiring connecting the power storage unit to the load, the earth leakage detection device comprising:
a coupling capacitor including one end connected to a current path of the power storage unit connected to the load in a state of being insulated from a ground;
a voltage output unit that generates a periodic voltage periodically changing and applies the periodic voltage to another end of the coupling capacitor via a first resistor;
a second resistor and a third resistor connected in series between a connection point between the coupling capacitor and the first resistor, and a predetermined fixed potential;
a voltage measurement unit that measures a voltage at a voltage dividing point between the second resistor and the third resistor;
an earth leakage determination unit that determines whether or not an earth leakage occurs between the current path of the power storage unit and the ground based on a voltage measured by the voltage measurement unit in a state where the periodic voltage is output from the voltage output unit; and
a diagnosis unit that determines whether or not the coupling capacitor is normal based on a voltage measured by the voltage measurement unit when the switch is turned on in a state where a fixed voltage is output from the voltage output unit,
wherein when the switch is turned on, the diagnosis unit determines that the coupling capacitor is abnormal when a fluctuation range of a voltage measured by the voltage measurement unit is less than or equal to a specified value,
wherein the switch includes three relays that are:
a positive electrode relay inserted into a positive wiring, the positive wiring connecting a positive electrode of the power storage unit and one end of the load;
a negative electrode relay inserted into a negative wiring, the negative wiring connecting a negative electrode of the power storage unit and another end of the load; and
a precharge relay connected in parallel to the positive electrode relay or the negative electrode relay, and the diagnosis unit determines that the coupling capacitor is abnormal when a fluctuation range of the measured voltage in a period from when one of the three relays is turned on to when the three relays are turned on is less than or equal to the specified value.

* * * * *